US010009686B1

(12) United States Patent
Das et al.

(10) Patent No.: US 10,009,686 B1
(45) Date of Patent: Jun. 26, 2018

(54) FULLY-DIFFERENTIAL CURRENT DIGITAL-TO-ANALOG CONVERTER

(71) Applicant: Cirrus Logic International Semiconductor Ltd., Edinburgh (GB)

(72) Inventors: Tejasvi Das, Austin, TX (US); Xin Zhao, Austin, TX (US); John L. Melanson, Austin, TX (US)

(73) Assignee: Cirrus Logic, Inc., Austin, TX (US)

( * ) Notice: Subject to any disclaimer, the term of this patent is extended or adjusted under 35 U.S.C. 154(b) by 0 days. days.

(21) Appl. No.: 15/488,931

(22) Filed: Apr. 17, 2017

(51) Int. Cl.
 *H04R 3/00* (2006.01)
 *H04R 3/04* (2006.01)
 *H03M 1/66* (2006.01)

(52) U.S. Cl.
 CPC ............... *H04R 3/04* (2013.01); *H03M 1/66* (2013.01)

(58) Field of Classification Search
 CPC .................................. H04R 3/04; H03M 1/66
 See application file for complete search history.

(56) References Cited

U.S. PATENT DOCUMENTS

| 4,825,448 | A | * | 4/1989 | Critchlow | .............. | H03D 3/006 375/222 |
|---|---|---|---|---|---|---|
| 5,815,103 | A | | 9/1998 | Comminges et al. | | |
| 6,353,402 | B1 | * | 3/2002 | Kanamori | .............. | H03M 1/002 323/315 |
| 8,587,287 | B2 | | 11/2013 | Larsen et al. | | |
| 2003/0151567 | A1 | | 8/2003 | Hanada et al. | | |
| 2010/0052965 | A1 | | 3/2010 | Onizuka et al. | | |
| 2011/0012617 | A1 | * | 1/2011 | Goshima | ............... | H03M 1/109 324/555 |
| 2013/0027235 | A1 | * | 1/2013 | Riches | ................ | H03M 1/1004 341/120 |
| 2013/0076549 | A1 | * | 3/2013 | Bajdechi | .................. | G05F 3/08 341/144 |

(Continued)

FOREIGN PATENT DOCUMENTS

EP 1142122 A1 5/2001
EP 1130781 A2 9/2001

OTHER PUBLICATIONS

Combined Search and Examination Report under Sections 17 and 18(3), Application No. GB1708547.3, dated Nov. 24, 2017.

*Primary Examiner* — Brenda C Bernardi
(74) *Attorney, Agent, or Firm* — Jackson Walker L.L.P.

(57) ABSTRACT

A playback path may include an input configured to receive an input signal, an output configured to drive a differential output signal, a differential current-mode digital-to-analog converter configured to convert the input signal into the differential output signal, and a control circuit. The differential current-mode digital-to-analog converter may include a plurality of current-mode digital-to-analog elements configured to be selectively enabled and disabled based on the input signal and at least one reference element in a current mirror relationship with the plurality of current-mode digital-to-analog elements such that each individual current through each current-mode digital-to-analog element is a scaled version of a reference current of the at least one reference element. The control circuit may be configured to scale current mirror ratios between the at least one reference element and the plurality of current-mode digital-to-analog elements based on a characteristic of the input signal.

22 Claims, 2 Drawing Sheets

(56) References Cited

U.S. PATENT DOCUMENTS

2015/0063576 A1* 3/2015 Falcon .................. G06Q 30/02
 381/56
2017/0294888 A1* 10/2017 Berkhout ............. H03G 3/3015

\* cited by examiner

FULLY-DIFFERENTIAL CURRENT DIGITAL-TO-ANALOG CONVERTER

FIELD OF DISCLOSURE

The present disclosure relates in general to circuits for audio devices, including without limitation personal audio devices, such as wireless telephones and media players, and more specifically, to systems and methods relating to a fully-differential digital-to-analog converter.

BACKGROUND

Personal audio devices, including wireless telephones, such as mobile/cellular telephones, cordless telephones, mp3 players, and other consumer audio devices, are in widespread use. Such personal audio devices may include circuitry for driving a pair of headphones or one or more speakers. Such circuitry often includes a digital-to-analog converter (DAC) for converting a digital audio signal into a corresponding analog audio signal, which may be amplified and driven to a loudspeaker or other audio transducer.

One example of a DAC is a current DAC, which converts a digital audio signal into an equivalent current-mode audio signal. A current DAC may be single-ended, generating a single-ended current audio signal, or may be differential, generating a differential audio signal. In its simplest form, a differential current DAC may comprise a collection of switched current sources wherein each current source is switched between one of the differential outputs or a common-mode ground. The current sources may be fractionally weighted relative to each other (e.g., each current source may be weighted by a power of two relative to other current sources), and the output current on each of the differential outputs may be the sum of current flowing into and out of the output. In many implementations, each current source may be embodied as a scaled mirror from a reference leg current source of the current DAC. As a result, noise in such reference leg may be a critical parameter of the current DAC performance, as the mirroring ratio of the reference leg to each of the switched current sources may mirror and multiply such noise. To avoid the dominance of such noise, very low mirroring ratios may be established between the switched current source and the reference leg current source. However, such low mirroring ratios may lead to considerable consumption of power of the reference leg current, such that the reference leg becomes the dominant component of power consumption of the current DAC. Accordingly, systems and methods are desired to overcome this limitation in order to minimize both noise and power consumption in current DACs.

SUMMARY

In accordance with the teachings of the present disclosure, one or more disadvantages and problems associated with existing approaches to signal amplification in an audio system may be reduced or eliminated.

In accordance with embodiments of the present disclosure, a playback path may include an input configured to receive an input signal, an output configured to drive a differential output signal, a differential current-mode digital-to-analog converter configured to convert the input signal into the differential output signal, and a control circuit. The differential current-mode digital-to-analog converter may include a plurality of current-mode digital-to-analog elements configured to be selectively enabled and disabled based on the input signal and at least one reference element in a current mirror relationship with the plurality of current-mode digital-to-analog elements such that each individual current through each current-mode digital-to-analog element is a scaled version of a reference current of the at least one reference element. The control circuit may be configured to scale current mirror ratios between the at least one reference element and the plurality of current-mode digital-to-analog elements based on a characteristic of the input signal.

A method may include receiving an input signal and scaling current mirror ratios between at least one reference element and a plurality of current-mode digital-to-analog elements of a differential current-mode digital-to-analog converter based on a characteristic of the input signal, wherein the differential current-mode digital-to-analog converter is configured to convert the input signal into the differential output signal, the plurality of current-mode digital-to-analog elements are configured to be selectively enabled and disabled based on the input signal, and the at least one reference element is in a current mirror relationship with the plurality of current-mode digital-to-analog elements such that each individual current through each current-mode digital-to-analog element is a scaled version of a reference current of the at least one reference element.

Technical advantages of the present disclosure may be readily apparent to one skilled in the art from the figures, description and claims included herein. The objects and advantages of the embodiments will be realized and achieved at least by the elements, features, and combinations particularly pointed out in the claims.

It is to be understood that both the foregoing general description and the following detailed description are examples and explanatory and are not restrictive of the claims set forth in this disclosure.

BRIEF DESCRIPTION OF THE DRAWINGS

A more complete understanding of the present embodiments and advantages thereof may be acquired by referring to the following description taken in conjunction with the accompanying drawings, in which like reference numbers indicate like features, and wherein.

DETAILED DESCRIPTION

Figure 1:
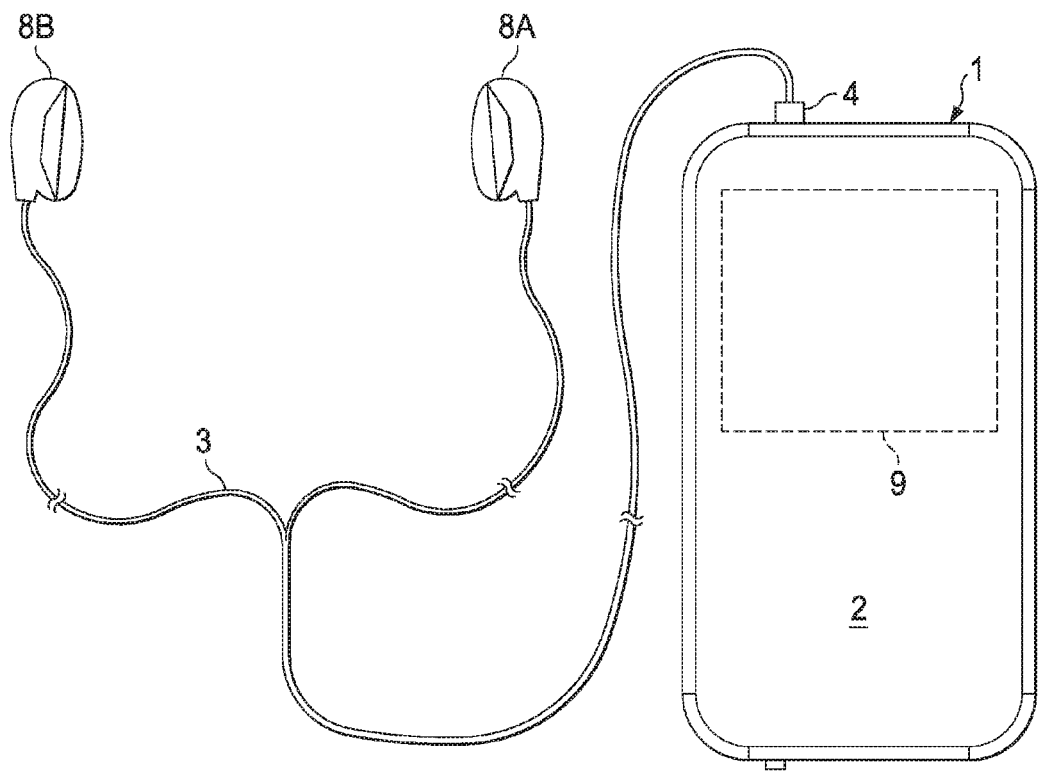
FIG. 1 is an illustration of an example personal audio device, in accordance with embodiments of the present disclosure.

FIG. 1 is an illustration of an example personal audio device 1, in accordance with embodiments of the present disclosure. FIG. 1 depicts personal audio device 1 coupled to a headset 3 in the form of a pair of earbud speakers 8A and 8B. Headset 3 depicted in FIG. 1 is merely an example, and it is understood that personal audio device 1 may be used in connection with a variety of audio transducers, including without limitation, headphones, earbuds, in-ear earphones, and external speakers. A plug 4 may provide for connection of headset 3 to an electrical terminal of personal audio device 1. Personal audio device 1 may provide a display to a user and receive user input using a touch screen 2, or alternatively, a standard liquid crystal display (LCD) may be combined with various buttons, sliders, and/or dials disposed on the face and/or sides of personal audio device 1. As also shown in FIG. 1, personal audio device 1 may include an audio integrated circuit (IC) 9 for generating an analog audio signal for transmission to headset 3 and/or another audio transducer.

Figure 2:
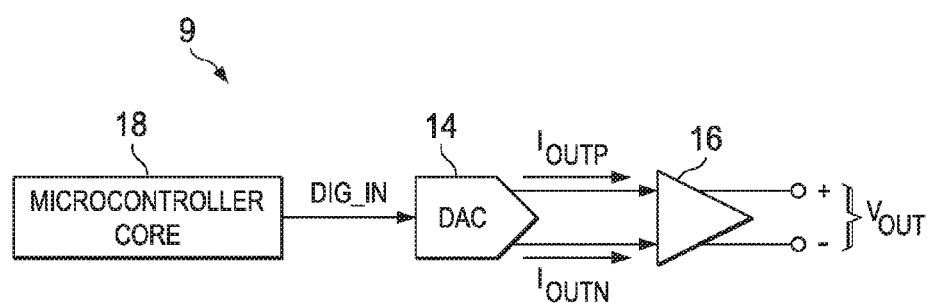
FIG. 2 is a block diagram of selected components of an example audio integrated circuit of a personal audio device, in accordance with embodiments of the present disclosure.

FIG. 2 is a block diagram of selected components of an example audio IC 9 of a personal audio device, in accordance with embodiments of the present disclosure. In some embodiments, example audio IC 9 may be used to implement audio IC 9 of FIG. 1. As shown in FIG. 2, a microcontroller core 18 may supply a digital audio input signal DIG_IN to a digital-to-analog converter (DAC) 14, which may convert the digital audio input signal to a differential analog current-mode input signal equal to the difference between currents $I_{OUTP}$ and $I_{OUTN}$. DAC 14 may supply a differential analog current-mode input signal to an amplifier 16 which may amplify or attenuate the differential analog current-mode input signal to provide an audio output signal $V_{OUT}$, which may operate a speaker, headphone transducer, a line level signal output, and/or other suitable output. Examples of amplifier 16 include a Class-AB amplifier and a Class-D amplifier.

Figure 3:
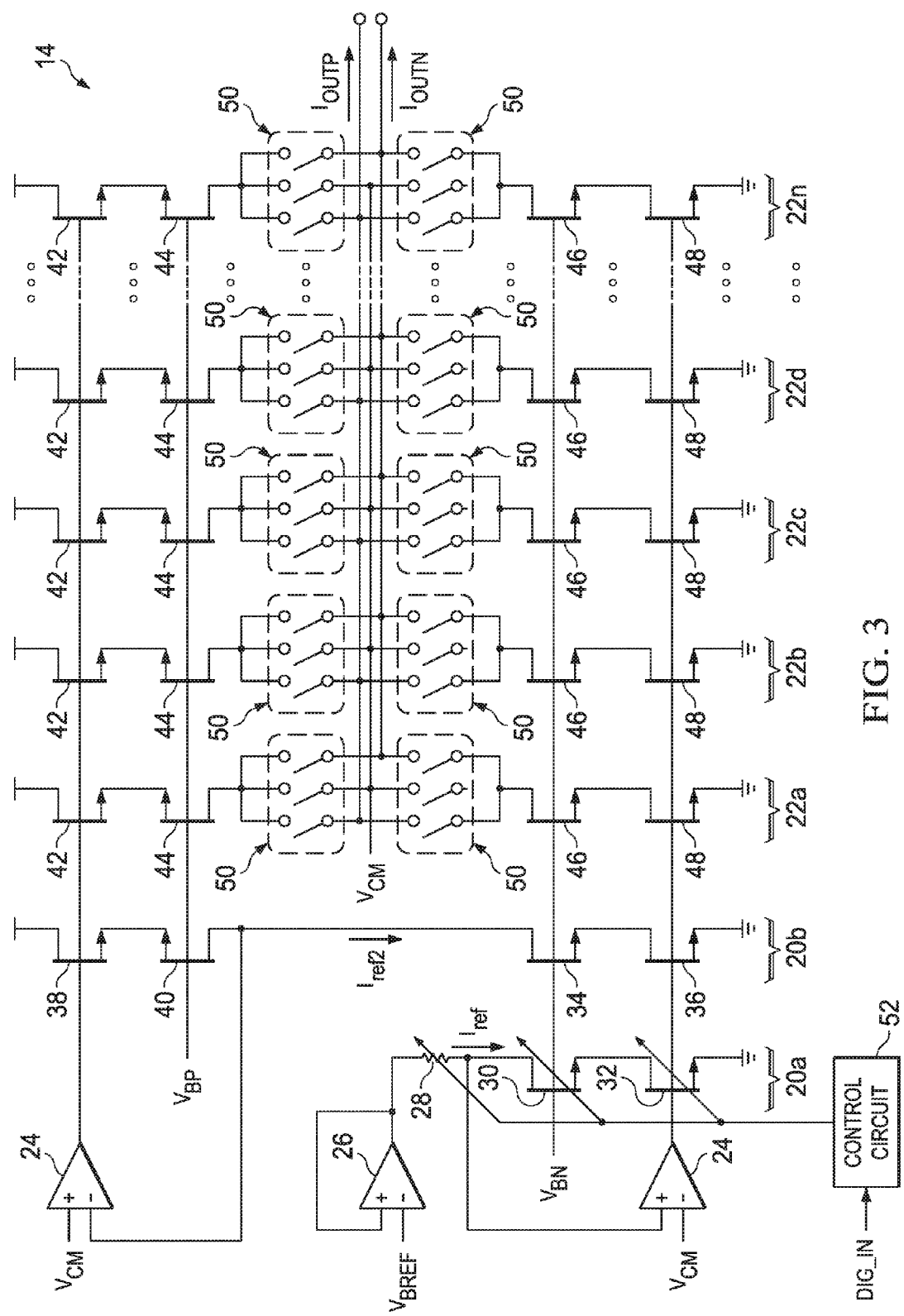
FIG. 3 is a block diagram of selected components of an example current DAC for use in the example audio integrated circuit of FIG. 2, in accordance with embodiments of the present disclosure.

FIG. 3 is a block diagram of selected components of an example current DAC 14 for use in example audio integrated circuit 9 of FIG. 2, in accordance with embodiments of the present disclosure. As shown in FIG. 3, current DAC 14 may include one or more reference elements 20 (e.g., 20a, 20b), a plurality of current-mode DAC elements 22 (e.g., 22a, 22b, 22c, 22d, . . . , 22n), biasing operational amplifiers 24 and 26, and a control circuit 52, as coupled as depicted in FIG. 3. Each DAC element 22 may comprise a differential current mirror comprising p-type field effect transistors 42 and 44, n-type field effect transistors 46 and 48, and a plurality of switches 50, coupled as shown in FIG. 3. Reference element 20a may comprise n-type field effect transistors 30 and 32 and a reference resistor 28 coupled as shown in FIG. 3. As shown in FIG. 3, reference resistor 28 may have a variable resistance controlled by control circuit 52. In addition or alternatively, one or both of n-type field effect transistors 30 and 32 may have an admittance controlled by control circuit 52. To implement an n-type field effect transistor 30 and/or 32 as a variable-admittance transistor, each such transistor may comprise a plurality of switched transistors that are enabled and/or disabled under the control of control circuit 52 in order to achieve the desired admittance. Reference element 20b may comprise n-type field effect transistors 34 and 36 and p-type field effect transistors 38 and 40, coupled as shown in FIG. 3.

In operation, a reference bias voltage $V_{BREF}$ may be applied as shown to operational amplifier 26 and a common mode voltage $V_{cm}$ may be applied as shown to operational amplifiers 24 to generate bias voltages for biasing n-type field effect transistors 32, 36, and 48 and p-type field effect transistors 38 and 42. In addition, a p-type bias voltage $V_{BP}$ may be applied to gates of p-type field effect transistors 38 and 40 to bias p-type field effect transistors 38 and 40, and an n-type bias voltage $V_{BN}$ may be applied to gates of n-type field effect transistors 30, 34, and 46 to bias n-type field effect transistors 30, 34, and 46. Accordingly, as so biased, a circuit is formed by which reference elements 20a and 20b generate reference currents $I_{ref}$ and $I_{ref2}$ as shown in FIG. 3, one of which (e.g., reference current $I_{ref2}$) may be used as a reference current for the differential current mirrors implemented by each current-mode DAC element 22. Thus, at least one reference element 20 may have a current mirror relationship with each of the plurality of current-mode DAC elements 22 such that each individual current through each current-mode DAC element 22 is a scaled version of a reference current (e.g., reference currents $I_{ref}$ and $I_{ref2}$) of the at least one reference element 20. Each current-mode DAC element 22 may be sized or otherwise configured such that it generates a current which is a power of 2 greater than or less than another current-mode DAC element 22. For example, current-mode DAC element 22a may generate a current having twice the magnitude of the current generated by current-mode DAC element 22b, current-mode DAC element 22b may generate a current having twice the magnitude of the current generated by current-mode DAC element 22c, and so on. For each current-mode DAC element 22, its respective switches 50 may be selectively enabled and disabled based on digital audio input signal DIG_IN. For example, each current-mode DAC element 22 may correspond to a respective bit of digital audio input signal DIG_IN, and the respective switches 50 of a current-mode DAC element 22 may be selectively enabled and disabled based on the respective bit. For purposes of clarity and exposition, the coupling of digital audio input signal DIG_IN and its individual bits to individual switches 50 is not shown. Accordingly, each current-mode DAC element 22 comprises a current source switched between one of the differential outputs (e.g., $I_{OUTP}$ or $I_{OUTN}$) or a common-mode ground (e.g., $V_{cm}$). Accordingly output currents (e.g., $I_{OUTP}$ or $I_{OUTN}$) on each of the differential outputs may be the sum of current flowing into and out of the particular output from the individual current-mode DAC elements 22.

Control circuit 52 may include any system, device, or apparatus configured to receive digital audio input signal DIG_IN (or another signal derived therefrom), and based on a characteristic (e.g., magnitude, frequency, etc.) of digital audio input signal DIG_IN, control one or more components of DAC 14 in order to scale current mirror ratios between at least one reference element 20 and the plurality of current-mode DAC elements 22. For example, control circuit 52 may modify current mirror ratios between at least one reference element 20 and the plurality of current-mode DAC elements 22 responsive to the magnitude of digital audio input signal DIG_IN crossing a predetermined threshold magnitude. As a specific example, in response to digital audio input signal DIG_IN crossing from above to below such predetermined threshold magnitude, control circuit 52 may control one or more components of DAC 14 to decrease a reference current (e.g., $I_{ref}$ and/or $I_{ref2}$) while increasing a scaling ratio of the currents of current-mode DAC elements 22 relative to a current of at least one reference element 20. In these and other embodiments, such predetermined threshold magnitude may be a threshold magnitude for entering or exiting a noise gating mode of the playback path of the audio signal, whereby noise gating involves for low magnitudes of an audio input signal (e.g., digital audio input signal DIG_IN), an output signal (e.g., difference between $I_{OUTP}$ or $I_{OUTN}$) of an audio system forced to zero, so as to avoid audio output of noise present in the signal path.

In some embodiments, control circuit 52 may be configured to modify current mirror ratios between the at least one reference element 20 and the plurality of current-mode digital-to-analog elements 22 by modifying a resistance (e.g., resistance of variable resistor 28) of the at least one reference element for setting a current of the at least one reference element. In these and other embodiments, control circuit 52 may be configured to modify current mirror ratios between the at least one reference element 20 and the plurality of current-mode digital-to-analog elements 22 by modifying an effective device size (e.g., admittance) of the at least one reference element 20 (e.g., the effective admittance of one or both of n-type field effect transistors 30 or 32) for setting a current of the at least one reference element 20. Although, for the purposes of descriptive clarity, FIG. 3 shows n-type field effect transistors 34 and 36 and p-type field effect transistors 38 and 40 as not having variable admittances controllable by control circuit 52, in some embodiments, control circuit 52 may be configured to modify current mirror ratios between the at least one reference element 20 and the plurality of current-mode digital-to-analog elements 22 by modifying an effective device size of one or more of n-type field effect transistors 34 and 36 and p-type field effect transistors 38 and 40 in addition to or in lieu of modifying an effective device size of n-type field effect transistors 30 and/or 32. Because control circuit 52 may perform such scaling of current mirror ratios by modifying components of a reference element 20: (a) such scaling of current mirror ratios may be performed such that an amount of current flowing through the plurality of current-mode digital-to-analog elements 22 is unchanged when the ratios are scaled and such that the current flowing through the reference element 20 is changed; and/or (b) the plurality of current-mode digital-to-analog elements may be unchanged when the ratios are scaled.

In these and other embodiments, in order to reduce or eliminate audio artifacts associated with modifying current mirror ratios, control circuit 52 may modify current mirror ratios during one or more blanking windows of the audio playback path of audio IC 9, wherein each of the one or more blanking windows comprises a finite time duration within a sampling period of DAC 14 in which the output of DAC 14 is prevented from being transmitted to a downstream circuit (e.g., amplifier 16) coupled to the output.

As used herein, when two or more elements are referred to as "coupled" to one another, such term indicates that such two or more elements are in electronic communication or mechanical communication, as applicable, whether connected indirectly or directly, with or without intervening elements.

This disclosure encompasses all changes, substitutions, variations, alterations, and modifications to the exemplary embodiments herein that a person having ordinary skill in the art would comprehend. Similarly, where appropriate, the appended claims encompass all changes, substitutions, variations, alterations, and modifications to the exemplary embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative.

All examples and conditional language recited herein are intended for pedagogical objects to aid the reader in understanding the invention and the concepts contributed by the inventor to furthering the art, and are construed as being without limitation to such specifically recited examples and conditions. Although embodiments of the present inventions have been described in detail, it should be understood that various changes, substitutions, and alterations could be made hereto without departing from the spirit and scope of the disclosure.

What is claimed is:

1. A playback path comprising:
   an input configured to receive an input signal;
   an output configured to drive a differential output signal; and
   a differential current-mode digital-to-analog converter configured to convert the input signal into the differential output signal, the differential current-mode digital-to-analog converter comprising:
      a plurality of current-mode digital-to-analog elements configured to be selectively enabled and disabled based on the input signal; and
      at least one reference element in a current mirror relationship with the plurality of current-mode digital-to-analog elements such that each individual current through each current-mode digital-to-analog element is a scaled version of a reference current of the at least one reference element; and
   a control circuit configured to scale current mirror ratios between the at least one reference element and the plurality of current-mode digital-to-analog elements based on is a frequency of the input signal.

2. The playback path of claim 1, wherein the characteristic of the input signal is a magnitude of the input signal.

3. The playback path of claim 2, wherein the control circuit is configured to modify current mirror ratios between the at least one reference element and the plurality of current-mode digital-to-analog elements responsive to the magnitude of the input signal crossing a predetermined threshold magnitude.

4. The playback path of claim 3, wherein the predetermined threshold magnitude is a threshold magnitude for entering or exiting a noise gating mode of the playback path.

5. The playback path of claim 1, wherein the control circuit scales the current mirror ratios such that an amount of current flowing through the plurality of current-mode digital-to-analog elements is unchanged when the ratios are scaled and such that another amount of current flowing through the at least one reference element is changed.

6. The playback path of claim 1, wherein the control circuit scales the current mirror ratios such that the plurality of current-mode digital-to-analog elements are unchanged when the ratios are scaled.

7. The playback path of claim 1, wherein the control circuit is configured to modify current mirror ratios between the at least one reference element and the plurality of current-mode digital-to-analog elements during one or more blanking windows of the playback path, wherein each of the one or more blanking windows comprises a finite time duration within a sampling period of the differential current-mode digital-to-analog converter in which the output of the differential current-mode digital-to-analog converter is prevented from being transmitted to a downstream circuit coupled to the output.

8. The playback path of claim 1, wherein the control circuit is configured to modify current mirror ratios between the at least one reference element and the plurality of current-mode digital-to-analog elements by modifying a resistance of the at least one reference element for setting a current of the at least one reference element.

9. The playback path of claim 1, wherein the control circuit is configured to modify current mirror ratios between the at least one reference element and the plurality of current-mode digital-to-analog elements by modifying an effective device size of the at least one reference element for setting a current of the at least one reference element.

10. The playback path of claim 1, further comprising an amplifier configured to amplify the differential output signal to generate an amplified differential output signal.

11. The playback path of claim 10, wherein the amplifier comprises one of a Class-AB audio amplifier and a Class-D audio amplifier.

12. A method comprising:
receiving an input signal; and
scaling current mirror ratios between at least one reference element and a plurality of current-mode digital-to-analog elements of a differential current-mode digital-to-analog converter based on a frequency of the input signal, wherein the differential current-mode digital-to-analog converter is configured to convert the input signal into a differential output signal, the plurality of current-mode digital-to-analog elements is configured to be selectively enabled and disabled based on the input signal, and at least one reference element is in a current mirror relationship with the plurality of current-mode digital-to-analog elements such that each individual current through each current-mode digital-to-analog element is a scaled version of a reference current of the at least one reference element.

13. The method of claim 12, wherein the characteristic of the input signal is a magnitude of the input signal.

14. The method of claim 13, further comprising modifying current mirror ratios between the at least one reference element and the plurality of current-mode digital-to-analog elements responsive to the magnitude of the input signal crossing a predetermined threshold magnitude.

15. The method of claim 14, wherein the predetermined threshold magnitude is a threshold magnitude for entering or exiting a noise gating mode of a playback path.

16. The method of claim 12, further comprising scaling the current mirror ratios such that an amount of current flowing through the plurality of current-mode digital-to-analog elements is unchanged when the ratios are scaled and such that another amount of current flowing through the at least one reference element is changed.

17. The method of claim 12, further comprising scaling the current mirror ratios such that the plurality of current-mode digital-to-analog elements are unchanged when the ratios are scaled.

18. The method of claim 12, further comprising modifying current mirror ratios between the at least one reference element and the plurality of current-mode digital-to-analog elements during one or more blanking windows of a playback path, wherein each of the one or more blanking windows comprises a finite time duration within a sampling period of the differential current-mode digital-to-analog converter in which an output of the differential current-mode digital-to-analog converter is prevented from being transmitted to a downstream circuit coupled to the output.

19. The method of claim 12, further comprising modifying current mirror ratios between the at least one reference element and the plurality of current-mode digital-to-analog elements by modifying a resistance of the at least one reference element for setting a current of the at least one reference element.

20. The method of claim 12, further comprising modifying current mirror ratios between the at least one reference element and the plurality of current-mode digital-to-analog elements by modifying an effective device size of the at least one reference element for setting a current of the at least one reference element.

21. The method of claim 12, further comprising an amplifier configured to amplify the differential output signal to generate an amplified differential output signal.

22. The method of claim 21, wherein the amplifier comprises one of a Class-AB audio amplifier and a Class-D audio amplifier.

* * * * *